(12) United States Patent
Oka

(10) Patent No.: US 11,424,102 B2
(45) Date of Patent: Aug. 23, 2022

(54) MODEL GENERATION APPARATUS, MODEL GENERATION PROGRAM, AND MODEL GENERATION METHOD

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 717 days.

(21) Appl. No.: 16/424,985

(22) Filed: May 29, 2019

(65) Prior Publication Data

US 2019/0371570 A1 Dec. 5, 2019

(30) Foreign Application Priority Data

May 29, 2018 (JP) .............................. JP2018-102593

(51) Int. Cl.
*H01J 37/32* (2006.01)
*C23C 16/455* (2006.01)
*H05H 1/46* (2006.01)

(52) U.S. Cl.
CPC .. *H01J 37/32082* (2013.01); *C23C 16/45502* (2013.01); *H01J 37/3244* (2013.01); *H05H 1/46* (2013.01); *H05H 1/4645* (2021.05)

(58) Field of Classification Search
CPC ............. H01J 37/3244; H01J 37/32082; H01J 37/32522; H01J 37/32724; H01J 37/32825; H01J 37/32935
See application file for complete search history.

(56) References Cited

U.S. PATENT DOCUMENTS

| 2005/0115824 | A1* | 6/2005 | Donohue | ................ | H01L 22/20 257/E21.252 |
| 2011/0132541 | A1* | 6/2011 | Tandou | ............. | H01L 21/67017 156/345.27 |
| 2012/0186745 | A1* | 7/2012 | Miya | ................. | H01J 37/32715 156/345.27 |

FOREIGN PATENT DOCUMENTS

JP 2008-177285 A 7/2008
JP 2017-005128 A 1/2017

* cited by examiner

*Primary Examiner* — Tung X Le
(74) *Attorney, Agent, or Firm* — Weihrouch IP

(57) ABSTRACT

When a plasma processing apparatus changes processing parameters of a plasma processing that include at least a temperature of a stage and a temperature of each zone obtained by dividing a placing surface of the stage into multiple patterns, and measures the temperature of each zone and a supply current to a hater in a state where the temperature is stabilized, an acquisition unit acquires the measurement data. The generator generates a prediction model using the measurement data, assuming that heat with heat quantity proportional to a temperature difference between adjacent zones moves therebetween, heat with heat quantity proportional to a temperature difference between the stage and each zone moves therebetween, heat with heat quantity calculated from the supply current to the heater of each zone is input to the zone, and quantity of heat input and quantity of heat output in each zone are consistent.

20 Claims, 8 Drawing Sheets

| SET TEMPERATURE (°C) | | | | | HF (W) | LF (W) | PRES-SURE (mT) |
|---|---|---|---|---|---|---|---|
| STAGE | Center | Middle | Edge | Very Edge | FR | | | |
| 10 | 60 | 55 | 60 | 60 | 60 | 1000 | 1000 | 100 |

MODEL GENERATION APPARATUS, MODEL GENERATION PROGRAM, AND MODEL GENERATION METHOD

CROSS-REFERENCE TO RELATED APPLICATIONS

This application is based on and claims priority from Japanese Patent Application No. 2018-102593, filed on May 29, 2018, with the Japan Patent Office, the disclosure of which is incorporated herein in its entirety by reference.

TECHNICAL FIELD

The present disclosure relates to a model generation apparatus, a model generation program, and a model generation method.

BACKGROUND

In a plasma processing such as a plasma etching, the temperature of a substrate such as a semiconductor wafer is one of important parameters for obtaining satisfactory plasma characteristics. Thus, in a plasma processing apparatus that performs a plasma processing, the placing surface of a stage on which the substrate is to be placed is divided into a plurality of zones, and a heater capable of independently controlling the temperature of each zone is embedded in the corresponding zone, such that the temperature distribution of the placing surface is controlled by the heater of each zone, thereby controlling the temperature of the substrate.

However, during the plasma processing, heat is introduced to the substrate from the plasma. As a result, the temperature of the substrate may become excessively high due to the heat introduced to the substrate from the plasma, according to process conditions. For example, the temperature of the substrate may exceed a desired temperature even when the power supplied to the heater is set to zero. Accordingly, for example, in a plasma processing apparatus, the temperature distribution of the substrate is measured in advance while changing process conditions such as a temperature of each heater and a temperature of the stage, to generate map data indicating a controllable range, based on the measured data. See Japanese Patent Laid-Open Publication Nos. 2008-177285 and 2017-005128.

SUMMARY

According to an aspect of the present disclosure, a model generation apparatus includes a memory; and a processor coupled to the memory and configured to: acquire measurement data from a plasma processing apparatus including a stage provided inside a processing container to place a substrate thereon, a temperature regulator provided in the stage to regulate a temperature of the entire stage, a heater provided in each zone obtained by dividing a placing surface of the stage, and a heater controller provided to regulate a temperature of a thermometer of each zone to a predetermined value by changing a value of a factor related to a power flowing to the heater, wherein the measurement data includes the temperature of each zone and the value of the factor related to the power flowing to the heater which are obtained in a state where the temperature of each zone is stabilized after the plasma processing apparatus changes processing parameters of the plasma processing that include at least a temperature of the temperature regulator and the temperature of each zone into a plurality of patterns, and starts a control to change the value of the factor related to the power flowing to the heater by using the heater controller for each pattern to make the temperature of each zone reach the temperature of each zone determined as the processing parameters; and generate a prediction model representing a relationship of the processing parameters by using the acquired measurement data, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
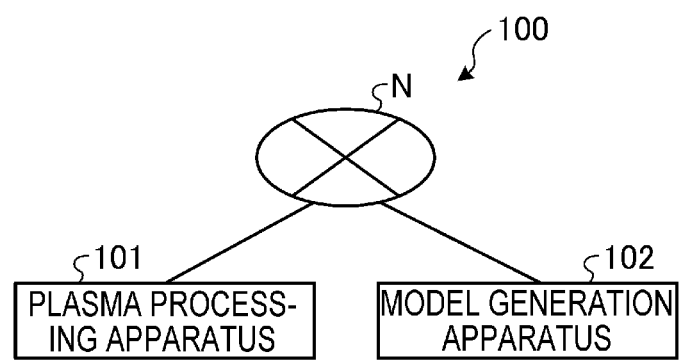
FIG. 1 is a schematic configuration diagram of a system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a model generation apparatus, a model generation program, and a model generation method according to the present disclosure will be described in detail with reference to the drawings. In the respective drawings, the same or corresponding portions will be denoted by the same reference numerals. In addition, the present disclosure is not limited by the embodiments. The embodiments may be appropriately combined with each other within the scope that does not cause any inconsistency in process contents.

<Configuration of System>

First, a schematic configuration of a system according to an embodiment will be described. A system 100 generates a prediction model for predicting process conditions of a substrate processing. The present embodiment will be described assuming, for example, a case where a prediction model is generated to predict process conditions of a plasma processing for performing a plasma etching as a substrate processing on a substrate. FIG. 1 is a schematic configuration diagram of the system according to the embodiment. The system 100 includes a plasma processing apparatus 101 and a model generation apparatus 102. The plasma processing apparatus 101 and the model generation apparatus 102 are connected to each other to be able to communicate via a network N. As for the network N, any type of communication network such as a local area network (LAN) or a virtual private network (VPN) may be adopted, regardless whether the communication network is a wired or wireless network.

The plasma processing apparatus 101 performs a predetermined substrate processing on a substrate. In the present embodiment, the plasma processing apparatus 101 performs a plasma etching on a semiconductor wafer (hereinafter, referred to as a "wafer") as a substrate. In the plasma processing apparatus 101, the placing surface of a stage on which the wafer is to be placed is divided into a plurality of zones, and a heater capable of independently controlling the temperature of each zone is embedded in the corresponding zone. The plasma processing apparatus 101 controls the temperature distribution of the placing surface by using the heater of each zone, so as to control the temperature of the wafer. When the prediction model is generated, the plasma processing apparatus 101 changes processing parameters of the plasma processing into a plurality of patterns, and measures the temperature of each zone in a state where the temperature is stabilized for each pattern.

The model generation apparatus 102 generates the prediction model. When the prediction model is generated, the model generation apparatus 102 acquires measurement data measured by the plasma processing apparatus 101. The model generation apparatus 102 generates the prediction model by using the acquired measurement data.

<Example of Configuration of Plasma Processing Apparatus>

Figure 2:
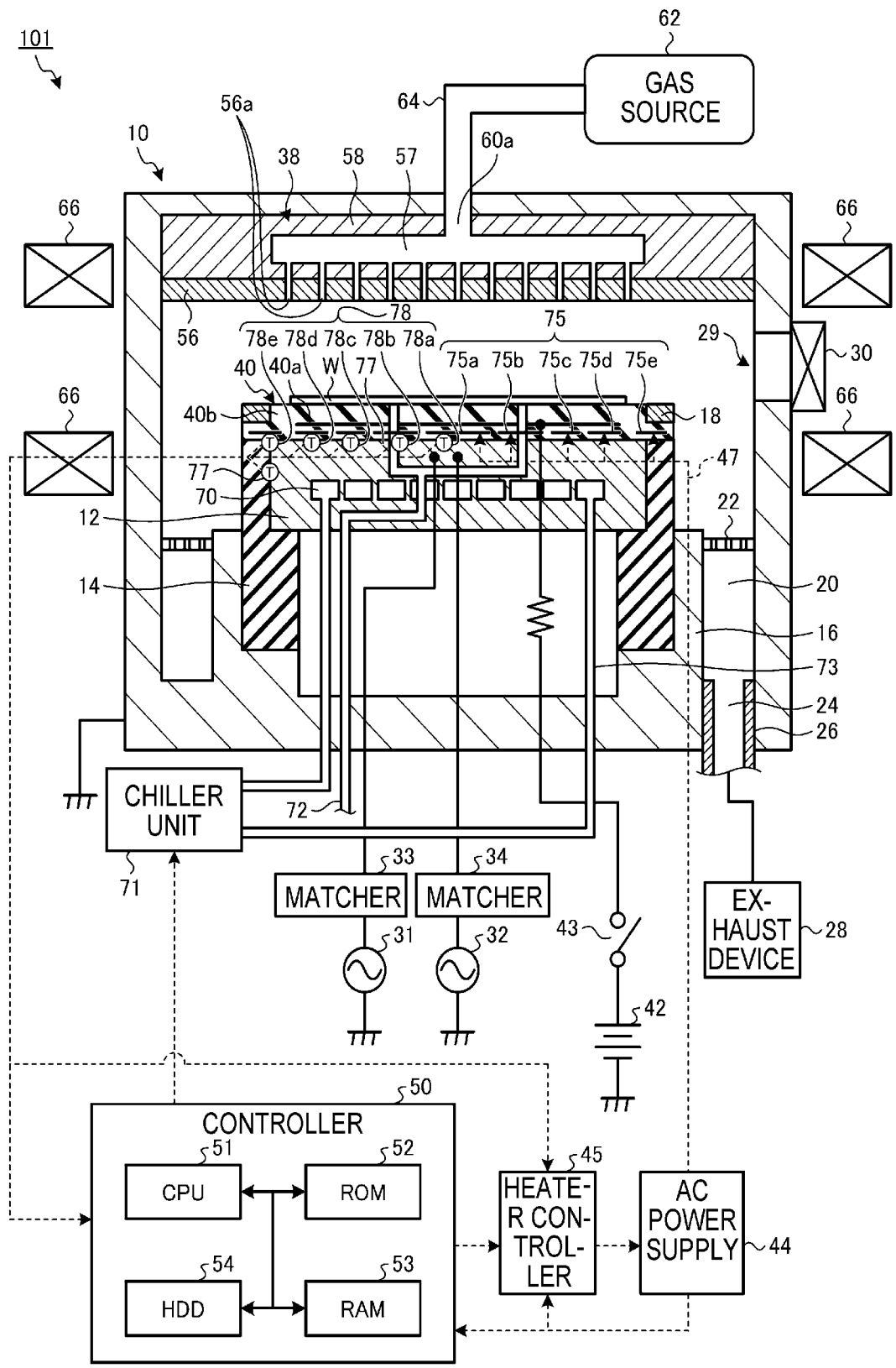
FIG. 2 is a view illustrating an example of a configuration of a plasma processing apparatus according to an embodiment.

Next, a configuration of the plasma processing apparatus 101 will be described. FIG. 2 is a view illustrating an example of a configuration of the plasma processing apparatus according to the embodiment. In the present embodiment, a capacitively coupled plasma processing apparatus will be described as an example of the plasma processing apparatus 101.

The plasma processing apparatus 101 includes a cylindrical chamber 10 of which the surface is made of, for example, alumite-processed (anodized) aluminum. The chamber 10 is grounded.

A stage 12 is provided inside the chamber 10. The stage 12 is made of, for example, aluminum (Al), titanium (Ti), or silicon carbide (SiC), and is supported by a support 16 via an insulating holder 14. Accordingly, the stage 12 is installed on the bottom of the chamber 10.

An exhaust pipe 26 is provided at the bottom of the chamber 10. The exhaust pipe 26 is connected to an exhaust device 28. The exhaust device 28 is configured to include a vacuum pump such as a turbo molecular pump or a dry pump. The exhaust device 28 depressurizes the processing space inside the chamber 10 to a predetermined vacuum level, and guides a gas inside the chamber 10 to an exhaust path 20 and an exhaust port 24 so as to exhaust the gas. A baffle plate 22 is attached in the exhaust path 20 to control the flow of a gas. In addition, a carry-in/out port 29 is provided in the side wall of the chamber 10 to carry the wafer W into and out from the chamber 10. A gate valve 30 is provided at the carry-in/out port 29. The carry-in/out port 29 is openable/closable by the gate valve 30.

A first radio-frequency power supply 31 is connected to the stage 12 via a matcher 33. Further, a second radio-frequency power supply 32 is connected to the stage 12 via a matcher 34. For example, the first radio-frequency power supply 31 applies a radio-frequency power of a relatively high predetermined frequency (HF), which is suitable for generating plasma in the chamber 10 (a radio-frequency power for plasma excitation) (e.g., 60 MHz), to the stage 12. The second radio-frequency power supply 32 applies a radio-frequency power of a relatively low predetermined frequency (LF), which is suitable for attracting ions in the plasma into the wafer W on the stage 12 (a radio-frequency power for ion attraction) (e.g., 13.56 MHz), to the stage 12. Accordingly, the stage 12 places the wafer W thereon, and functions as a lower electrode.

An electrostatic chuck 38 is provided on the upper surface of the stage 12 to hold the wafer W by an electrostatic attraction force. The electrostatic chuck 40 is formed by sandwiching an electrode 40a made of a conductive film between a pair of insulating layers 40b (or insulating sheets), and a DC voltage source 42 is connected to the electrode 40a via a switch 43. The electrostatic chuck 40 attracts and holds the wafer W thereon by the Coulomb force generated by the voltage from the DC voltage source 42.

A focus ring 18 is disposed on the stage 12 to surround the periphery of the wafer W. The focus ring 18 is formed of, for example, silicon or quartz. The focus ring 18 functions to improve the in-plane uniformity of etching.

On the ceiling of the chamber 10, a gas shower head 38 is provided as an upper electrode of a ground potential. As a result, the radio-frequency power output from the first radio-frequency power supply 31 is capacitively applied between the stage 12 and the gas shower head 38.

The gas shower head 38 includes an electrode plate 56 disposed to face the stage 12 and an electrode support 58 that detachably supports the electrode plate 56. A gas diffusion chamber 57 is formed inside the electrode support 58. A large number of gas vents 56a are formed in the electrode plate 56 and the electrode support 58 to communicate with the gas diffusion chamber 57. A gas inlet 60a is provided in the upper surface of the electrode support 58 to communicate with the gas diffusion chamber 57. The gas inlet 60a is connected to a gas source 62 via a gas supply pipe 64. The gas source 62 supplies various gases which are used for the plasma processing. A gas supplied from the gas source 62 is diffused in the gas diffusion chamber 57 through the gas supply pipe 64 and the gas inlet 60a, and introduced into the chamber 10 from the large number of gas vents 56a. An annular or concentrically extending magnet 66 is disposed around the chamber 10 to control plasma generated by a magnetic force in the plasma generation space between the upper electrode and the lower electrode.

In the stage 12, the placing surface on which the wafer W and the focus ring 18 are to be placed is divided into a plurality of zones, and heaters 75a, 75b, 75c, 75d, and 75e (hereinafter, collectively referred to as "heaters 75") are embedded in the zones, respectively. Instead of being embedded in the electrostatic chuck 40, the heaters 75 may be attached to the back surface of the electrostatic chuck 40. Power feeding lines 47 are connected to the heaters 75a, 75b, 75c, 75d, and 75e, respectively. In addition, FIG. 2 represents the power feeding lines 47 in an integrated and simplified form. The power feeding lines 47 are connected to an AC power supply 44. The AC power supply 44 is capable of individually controlling the power supplied to each of the power feeding lines 47. Currents output from the AC power supply 44 are supplied to the heaters 75a, 75b, 75c, 75d, and 75e through the power feeding lines 47. The temperatures of the wafer W and the focus ring 18 may be increased by a resistance heating (Joule heating) generated as the currents supplied to the resistance components of the heaters 75 flow through the resistance components.

Thermometers 78a, 78b, 78c, 78d, and 78e (hereinafter, collectively referred to as "thermometers 78") are provided in the zones where the heaters 75a, 75b, 75c, 75d, and 75e are embedded, respectively, to be separate from the heaters. As a result, the temperature in each zone may be measured. In addition, the thermometers 78 may be elements capable of measuring a temperature which is separate from the heaters 75. In addition, in view of the characteristic that an electric resistance of a main metal increases in proportion to a temperature rise, the thermometers 78 may measure a temperature by using a method of estimating a temperature from a resistance value obtained from a measurement of the voltage or currents to the heaters 75.

Values of the currents supplied by the AC power supply 44 are controlled by a heater controller 45. The heater controller 45 controls the supply currents flowing from the AC power supply 44 to the heaters 75, to reach a target (set) temperature value of the heaters 75 which is received from a controller 70 to be described later, while referring to the temperatures of the heaters fed back from the respective thermometers 78.

Figure 3A:
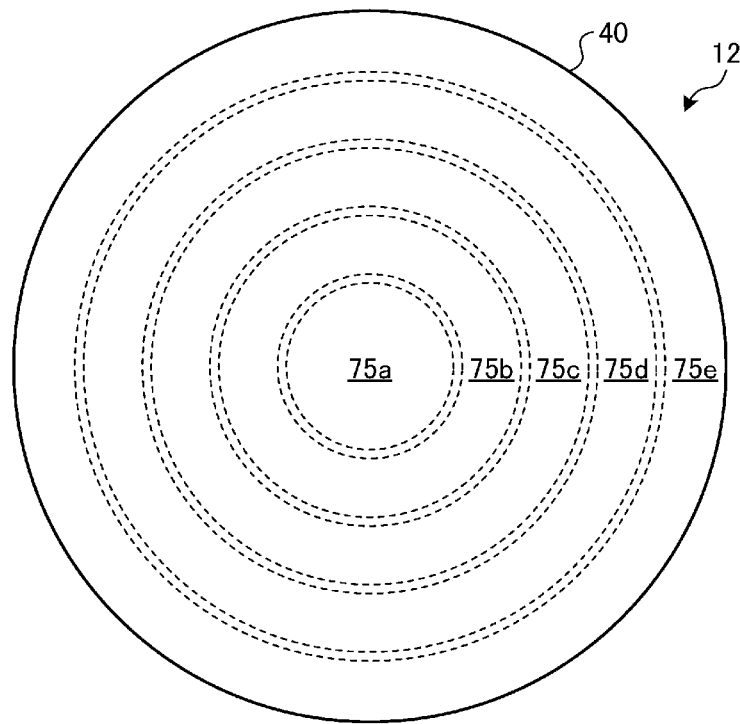
FIG. 3A is a view illustrating an example of an arrangement of heaters according to an embodiment.
Figure 3B:
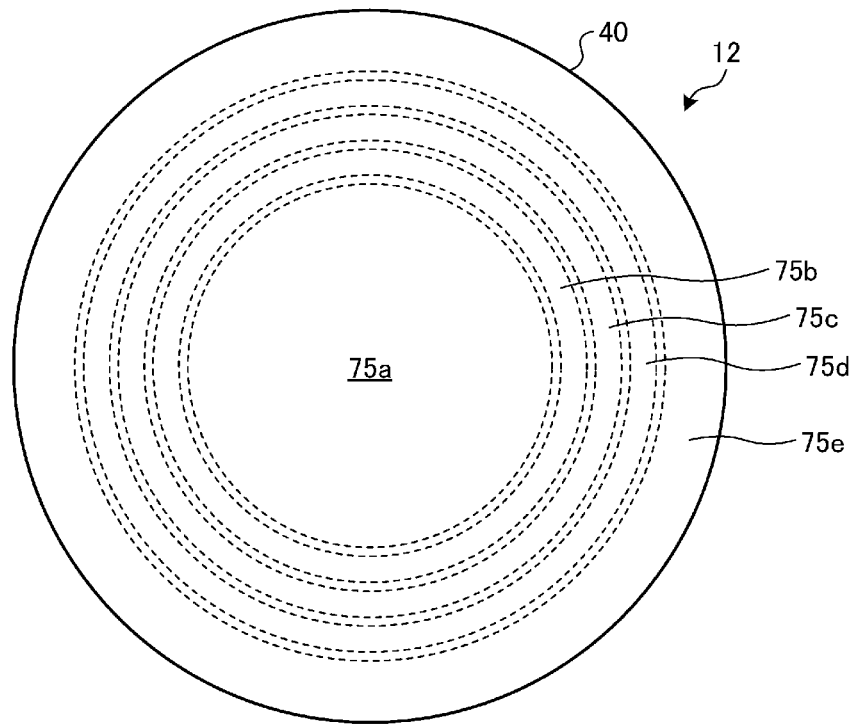
FIG. 3B is a view illustrating another example of the arrangement of the heaters according to an embodiment.

FIG. 3A is a view illustrating an example of an arrangement of the heaters according to the embodiment. FIG. 3A is a top view of the stage 12. In the stage 12, the ranges of the zones where the heaters 75a, 75b, 75c, 75d, and 75e are embedded are indicated by dashed lines. As illustrated in FIG. 3A, in the stage 12, the heaters 75a, 75b, 75c, 75d, and 75e are embedded at equal intervals from the center of the stage 12. The heater 75a heats the center of the stage 12. The heater 75b heats the middle of the stage 12. The heater 75c heats the edge of the stage 12. The heater 75d heats the very edge of the stage 12. The heater 75e heats the focus ring 18. The heaters 75a, 75b, 75c, 75d, and 75e are capable of heating the circular zone (the center) and the four annular zones (the middle, the edge, the very edge, and the focus ring portion), respectively, obtained by dividing the in-plane of the stage 12 in an order from the center toward the outer periphery of the in-plane of the stage 12. In the present embodiment, the in-plane of the stage 12 is divided into the five zones such that the temperature of each zone is controlled. However, the number of zones is not limited to five, and may be two to four, or six or more. The number of heaters 75 may be determined according to the number of zones and the presence/absence of the focus ring 18. In addition, each zone may have a shape other than the circular or annular shape. In addition, the arrangement of the heaters 75 illustrated in FIG. 3A is an example and is not limited thereto. FIG. 3B is a view illustrating another example of the arrangement of the heaters according to the embodiment. As illustrated in FIG. 3B, the heaters 75a, 75b, 75c, and 75d are embedded in the electrostatic chuck 40 with a large interval near the center of the stage 12 and with a small interval near the outer periphery of the stage 12.

Referring back to FIG. 2, a coolant pipe 70 is formed inside the stage 12. Both the ends of the coolant pipe 70 are connected to a chiller unit 71 via a coolant circulation pipe 73. The chiller unit 71 circulates a coolant (hereinafter, referred to as "brine") through the coolant pipe 70 via the coolant circulation pipe 73. In addition, the chiller unit 71 is capable of controlling the temperature of the coolant to reach a target (set) temperature value of the coolant which is received from a controller 50 to be described later. The coolant supplied from the chiller unit 71 circulates through the coolant pipe 70 and the coolant circulation pipe 73 to cool the entire stage 12. The chiller unit 71 and the mechanism for supplying the Brine to the coolant pipe 70 are an example of a temperature regulator that regulates the temperature of the entire stage 12.

A temperature sensor 77 is provided in the stage 12. The temperature sensor 77 measures the temperature of the stage 12 cooled by the chiller unit 71 and the mechanism for supplying the Brine to the coolant pipe 70.

With this configuration, each of the zones of the stage 12 where the heaters 75a, 75b, 75c, 75d, and 75e are embedded, respectively, is independently heated, and cooled as the Brine having a predetermined temperature flows through the coolant pipe 70 in the stage 12. As a result, the wafer W is regulated to a desired temperature. In addition, a heat transfer gas such as helium (He) gas is supplied between the upper surface of the electrostatic chuck 40 and the back surface of the wafer W via a heat transfer gas supply line 72.

The controller 50 includes a CPU 51, a read only memory (ROM) 52, a random access memory (RAM) 53, and a hard disk drive (HDD) 54. The CPU 51 performs a plasma processing such as etching according to a procedure set in a recipe recorded in the recording unit of the ROM 52, the RAM 53 or the HDD 54. In addition, various data such as a data table to be described later are recorded in the recording unit. The controller 50 controls the temperature of the heating mechanism such as the heaters 75 or the cooling mechanism such as the Brine, by using the heater controller 45 or the chiller unit 71. In addition, the heater controller 45 may be a part of the controller 50.

In the plasma processing apparatus 101 having the above-described configuration, the wafer W is first carried into the chamber 10 from the gate valve 30 when a plasma processing such as etching is performed. The wafer W is placed on the electrostatic chuck 40. The gate valve 30 is closed after the wafer W is carried into the chamber 10. The pressure in the chamber 10 is reduced to a set value by the exhaust device 28. When a voltage is applied from the DC voltage source 42 to the electrode 40a of the electrostatic chuck 40, the wafer W is electrostatically attracted onto the electrostatic chuck 40.

A predetermined gas is introduced into the chamber 10 from the gas shower head 38 in the shower form, and the radio-frequency power for plasma excitation HF is applied to the stage 12. The introduced gas is ionized and dissociated by the radio-frequency power HF so that plasma is generated, and a plasma processing such as etching is performed on the wafer W by the action of the plasma. The radio-frequency power for ion attraction LF may be applied to the stage 12. After the plasma etching is completed, the wafer W is carried to the outside of the chamber 10.

Further, when the plasma processing such as etching is performed, the plasma processing apparatus 101 changes processing parameters of the plasma processing into a plurality of patterns, measures the temperature of each zone in a state where the temperature is stabilized for each pattern, and generates measurement data in which the measurement results are recorded in association with the processing parameters of each pattern. Details of the processing parameters or the measurement data will be described later. The plasma processing apparatus 101 transmits the generated measurement data to the model generation apparatus 102.

<Example of Configuration of Model Generation Apparatus>

Figure 4:
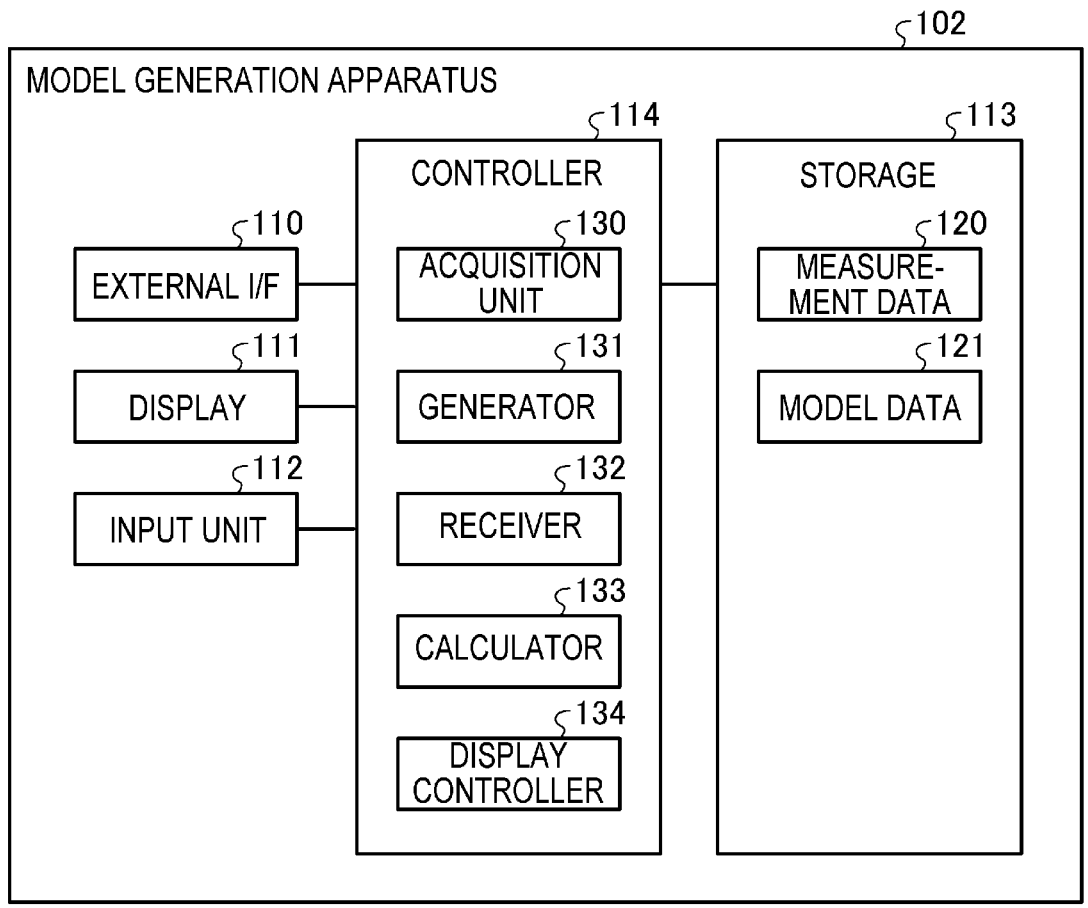
FIG. 4 is a view illustrating an example of a configuration of a model generation apparatus according to an embodiment.

Next, a configuration of the model generation apparatus 102 will be described. FIG. 4 is a view illustrating an example of a configuration of the model generation apparatus according to the embodiment. In the present embodiment, an information processing apparatus such as a personal computer or a server computer will be described as an example of the model generation apparatus 102.

The model generation apparatus 102 includes an external interface (I/F) 110, a display 111, an input unit 112, a storage 113, and a controller 114. In addition, the model generation apparatus 102 may have various functional units of a well-known computer, in addition to the functional units illustrated in FIG. 4.

The external I/F 110 is an interface that inputs/outputs information with respect to another apparatus. For example, the external I/F 110 controls a communication with another apparatus. As an aspect of the external I/F 110, a network interface card such as a LAN card may be adopted. For example, the external I/F 110 receives the measurement data from the plasma processing apparatus 101 via the network N. In addition, the external I/F 110 may be, for example, an interface such as a universal serial bus (USB) port.

The display 111 is a display device that displays various types of information. The display 111 may be, for example, a liquid crystal display (LCD) or a cathode ray tube (CRT). The display 111 displays various types of information.

The input unit 112 is an input device that inputs various types of information. The input unit 112 may be, for example, a mouse or a keyboard. The input unit 112 receives an operation input from, for example, an administrator, and inputs operation information indicating the contents of the received operation to the controller 114.

The storage 113 is a storage device that stores various data. The storage 113 is, for example, a hard disk, a solid state drive (SSD), or an optical disk. In addition, the storage 113 may be a semiconductor memory in which data is rewritable, such as a random access memory (RAM), a flash memory, or a nonvolatile static random access memory (NV SRAM).

The storage 113 stores an operating system (OS) or various programs which are executed by the controller 114. For example, the storage 113 stores various programs that include a prediction model generation program for executing a prediction model generation process to be described later and a prediction program for executing a prediction process to be described later. Further, the storage 113 stores various data which are used in a program executed by the controller 114. For example, the storage 113 stores measurement data 120 and model data 121. In addition, the storage 113 may store other data along with the data described above.

The measurement data 120 is the measurement data received from the plasma processing apparatus 101. In the measurement data 120, the measurement results of each pattern which are obtained when the processing parameters of the plasma processing are changed into a plurality of patterns, and the temperature of each zone is measured in a state where the temperature is stabilized for each pattern are recorded in association with the processing parameters from which the measurement results are obtained. The processing parameters include parameters that affect the temperature of each zone. The temperature of each zone changes according to, for example, the temperature of each heater 75 or the temperature of the stage 12. The temperature of the heater 75 changes according to a change in the value of the factor related to the power flowing to the heater 75. Thus, the processing parameters include at least a parameter related to the control of the temperature of the stage 12 and the value of the factor related to the power flowing to the heater 75 of each zone. The value of the factor related to the power flowing to the heater 75 may be, for example, a power, voltage or current. In the present embodiment, the value of the factor related to the power is a supply current to the heater 75. In addition, the value of the factor related to the power is not limited to the supply current to the heater 75, and may be a supply voltage or supply power to the heater 75.

Here, according to the Ohm's law, in general, a power P, a current R, a voltage V, and a resistance R have the relationship of the following equation (1).

$$\begin{aligned} P &= V \times I \\ &= R \times I^2 \\ &= 1/R \times V^2 \end{aligned} \quad (1)$$

Accordingly, the supply power to the heater 75, the supply current to the heater 75, and the supply voltage to the heater 75 have the relationship of the following equation (2).

Supply power to heater 75=(supply current to heater 75)×(supply voltage to heater 75)

∝ square of (supply current to heater 75)

∝ square of (supply voltage to heater 75)  (2)

The model data 121 is data in which a prediction model is stored.

Here, the prediction model will be described. The inventors of the present disclosure have focused on the following three physical laws. The first physical law is the Fourier's law. A quantity of heat that moves between solids is proportional to a temperature difference. The second physical law relates to the balance of heat. In a case where the temperature of each zone is in a stable state, the heat balance of each zone becomes constant. The third physical law is the Joule's law. When the value of the factor related to the power flowing to the heater 75 is the supply current to the heater 75, a heat generation quantity of the heater 75 becomes a value obtained by multiplying the square of the supply current to the heater 75 by the resistance of the heater. Thus, the heat generation quantity of the heater 75 is proportional to the square of the supply current to the heater 75. Hereinafter, descriptions will be made assuming the case where the value of the factor related to the power flowing to the heater 75 is the supply current to the heater 75.

In addition, in a case where the value of the factor related to the power flowing to the heater 75 is the supply voltage to the heater 75, the heat generation quantity of the heater 75 becomes a value obtained by dividing the resistance of the heater by the square of the supply voltage to the heater 75. Accordingly, the heat generation quantity of the heater 75 is proportional to the square of the supply voltage to the heater 75. In addition, in a case where the value of the factor related to the power flowing to the heater 75 is the supply power to the heater 75, the heat generation quantity of the heater 75 is proportional to the supply power to the heater 75.

Further, the inventors of the present disclosure have focused on the following plasma characteristics. The electron density of plasma is proportional to the power of the AC power applied for generating plasma, and mainly proportional to the power of the radio-frequency power HF. In addition, the resistance of plasma is inversely proportional to the power of the radio-frequency power HF. In addition, the spread of plasma depends on the pressure in the chamber 10. For example, the electron density and the entire resistance of plasma also depend on the pressure in the chamber 10.

In addition, it is known that heat input from plasma is proportional to the product of an amount of ions in plasma irradiated to the wafer W and a bias potential for attracting ions in plasma into the wafer W. The amount of ions in plasma irradiated to the wafer W is proportional to the plasma density. The bias potential for attracting ions in plasma into the wafer W is proportional to the power of the AC power applied for generating the bias potential, and mainly proportional to the power of the radio-frequency power LF. In addition, the bias potential depends on the pressure in the chamber 10. In addition, in a case where the radio-frequency power LF is not applied to the stage 12, the ions are attracted into the stage by a difference between the potential of plasma (plasma potential) generated when the plasma is generated and the potential of the stage 12.

In addition, the heat input from plasma includes, for example, a heating by a light emission of plasma, irradiation to the wafer W with electrons or radicals in plasma, and a surface reaction on the wafer W due to ions and radicals. These components also depend on the power of the AC power or the pressure.

Figure 5:
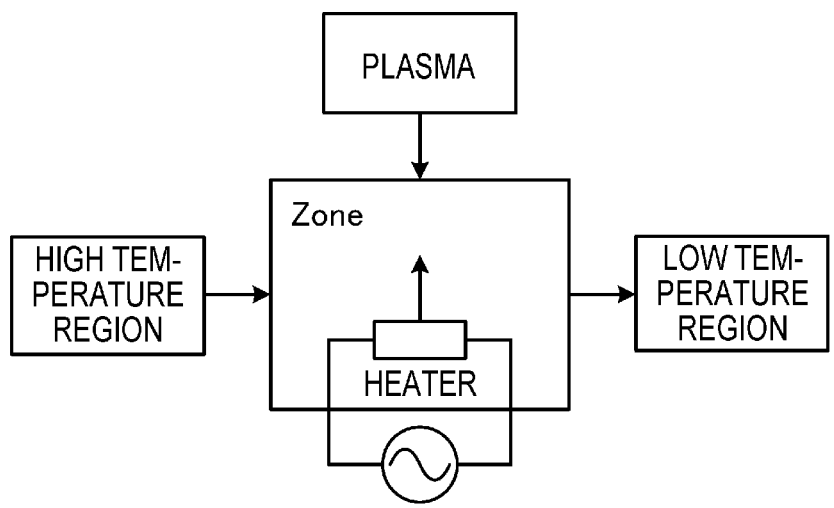
FIG. 5 is a view schematically illustrating an example of a flow of heat with respect to a zone where a heater is provided.

FIG. 5 is a view schematically illustrating an example of the flow of heat with respect to a zone where the heater is provided. FIG. 5 is a view schematically illustrating a heat transfer between solids, a heat input from plasma, and a heat input from the heater 75, in one zone where the heater 75 is embedded. When a high temperature zone is adjacent to the corresponding zone, heat is input from the high temperature zone to the corresponding zone. In addition, when the plasma processing is being performed, heat is input from plasma to the corresponding zone. Heat from the heater 75 is input to the corresponding zone. When a low temperature zone is adjacent to the corresponding zone, heat is output from the corresponding zone to the low temperature zone.

The stage 12 is cooled by the chiller unit 71 so that the temperature of the stage 12 is regulated, and the heat of each zone is absorbed. When the temperature of the stage 12 is in a stable state, the heat balance of the zone becomes constant as described above in the second physical law. Thus, when the temperature is in a stable state, the heat balance of one zone may be expressed as the following equation (3).

Heat generation quantity of heater+quantity of heat input from plasma+quantity of heat input from adjacent zone=quantity of heat output to adjacent zone+quantity of heat output to stage  (3)

As described above in the third physical law, the heat generation quantity of the heater 75 becomes a value obtained by multiplying the square of the supply current to the heater 75 by the resistance of the heater. The heat generation quantity of the heater 75 may be expressed as the following equation (4).

Heat generation quantity of heater=resistance of heater×(supply current to heater 75)$^2$  (4)

When the equation (4) is substituted to the heat generation quantity of the heater 75 in the equation (3), the equation (3) may be expressed as the following equation (5).

(supply current to heater)=(quantity of heat output to adjacent zone−quantity of heat input from adjacent zone+quantity of heat output to stage−quantity of heat input from plasma)/resistance of heater  (5)

The supply current to the heater 75 of each zone has the relationship of the equation (5).

Figure 6:
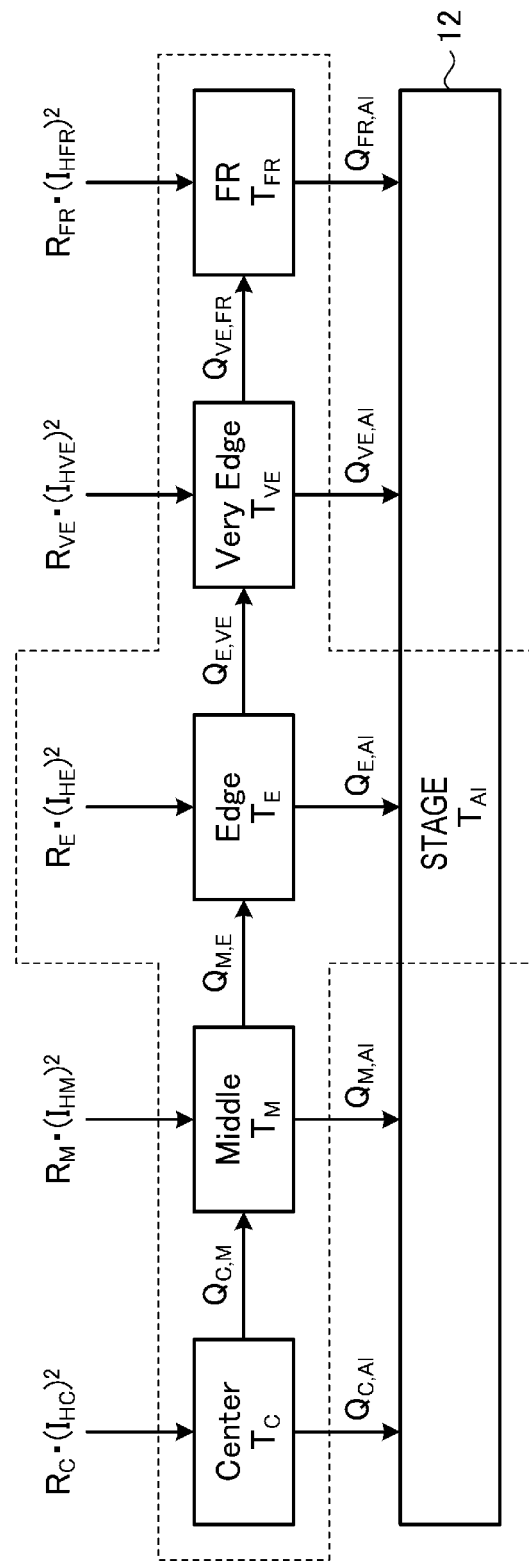
FIG. 6 is a view schematically illustrating an example of a flow of heat with respect to an edge.

Here, descriptions will be made focusing on the edge as each zone. First, the flow of heat excluding the heat input from plasma will be described. FIG. 6 is a view schematically illustrating an example of the flow of heat with respect to the edge. FIG. 6 represents the center (Center), the middle (Middle), the edge (Edge), the very edge (Very Edge), and the focus ring portion (FR). The heat from the heater 75 is input to each of the center, the middle, the edge, the very edge, and the focus ring portion. Further, in the center, the middle, the edge, the very edge, and the focus ring portion, the heat is transferred in proportion to the temperature difference from the stage 12. Further, in the center, the middle, the edge, the very edge, and the focus ring portion, the heat is transferred in proportion to the temperature difference from an adjacent zone.

For example, in FIG. 6, the temperature of the center is indicated as $T_C$. In addition, the heat generation quantity of the heater 75a of the center is indicated as $R_C \cdot (I_{HC})^2$. $R_C$ is the resistance value of the heater 75a. $I_{HC}$ is the supply current to the heater 75a. In addition, the quantity of heat output from the center to the stage 12 is indicated as $Q_{C,Al}$.

In addition, in FIG. 6, the temperature of the middle is indicated as $T_M$. In addition, the heat generation quantity of the heater 75b of the middle is indicated as $R_M \cdot (I_{HM})^2$. $R_M$ is the resistance value of the heater 75b. $I_{HM}$ is the supply current to the heater 75b. In addition, the quantity of heat output from the middle to the stage 12 is indicated as $Q_{M,Al}$.

In addition, in FIG. 6, the temperature of the edge is indicated as $T_E$. In addition, the heat generation quantity of the heater 75c of the edge is indicated as $R_E \cdot (I_{HE})^2$. $R_E$ is the resistance value of the heater 75c. $I_{HE}$ is the supply current to the heater 75c. In addition, the quantity of heat output from the edge to the stage 12 is indicated as $Q_{E,Al}$.

In addition, in FIG. 6, the temperature of the very edge is indicated as $T_{VE}$. In addition, the heat generation quantity of the heater 75d of the very edge is indicated as $R_{VE} \cdot (I_{HVE})^2$. $R_{VE}$ is the resistance value of the heater 75d. $I_{HVE}$ is the supply current to the heater 75d. In addition, the quantity of heat output from the very edge to the stage 12 is indicated as $Q_{VE,Al}$.

In addition, in FIG. 6, the temperature of the focus ring portion is indicated as $T_{FR}$. In addition, the heat generation quantity of the heater 75e of the focus ring portion is indicated as $R_{FR} \cdot (I_{HFR})^2$. RF is the resistance value of the heater 75e. $I_{HFR}$ is the supply current to the heater 75e. In addition, the quantity of heat output from the focus ring portion to the stage 12 is indicated as $Q_{FR,Al}$.

In addition, in FIG. 6, the quantity of heat input from the center to the middle is indicated as $Q_{C,M}$. The quantity of heat input from the middle to the edge is indicated as $Q_{M,E}$. The quantity of heat input from the edge to the very edge is indicated as $Q_{E,VE}$. The quantity of heat input from the very edge to the focus ring portion is indicated as $Q_{VE,FR}$.

In addition, in FIG. 6, the temperature of the stage 12 is indicated as $T_{Al}$. The temperature $T_{Al}$ of the stage 12 is controlled by the coolant supplied from the chiller unit 71. In the present embodiment, it is assumed that the temperature of the coolant supplied from the chiller unit 71 is used as the temperature $T_{Al}$ of the stage 12.

The quantity of heat output $Q_{C,Al}$, $Q_{M,Al}$, $Q_{E,Al}$, $Q_{VE,Al}$ or $Q_{FR,Al}$ is proportional to the difference between the temperature of each zone and the temperature $T_{Al}$ of the stage 12. In addition, the quantity of heat input $Q_{C,M}$, $Q_{M,E}$, $Q_{E,VE}$, or $Q_{VE,FR}$ is proportional to the temperature difference between the corresponding zones. Here, in principle, the relationship of the quantity of heat input and the quantity of heat output to the temperature difference is directly proportional. However, the relationship may include components of a relationship proportional to the square of the temperature difference and a relationship proportional to the square root of the temperature difference because the position where the temperature is measured and the position to which heat is transferred may be inconsistent with each other.

When the heat input from plasma is excluded, the relational expression of the above-described equation (3) or (5) may be obtained for each of the zones of the center, the middle, the edge, the very edge, and the focus ring portion, assuming that heat with a heat quantity proportional to a temperature difference between adjacent zones moves between the zones, heat with a heat quantity proportional to a temperature difference between the stage 12 and each zone moves between the stage 12 and the zone, heat with a heat quantity proportional to the square of the supply current to the heater 75 of each zone is input to the zone, and the quantity of heat input and the quantity of heat output in each zone are consistent with each other. For example, when the heat input from plasma is excluded, as indicated by a dashed line in FIG. 6, the supply current $I_{HE}$ to the heater 75 of the edge is affected mainly by the transfer of heat between adjacent zones and the transfer of heat between the edge and the stage 12. In this case, the square of the supply current $I_{HE}$ to the heater 75 of the edge may be expressed as the following equation (6).

$$(I_{HE})^2 = A_0 + A_1 \cdot f(T_C - T_M) + A_2 \cdot (T_C - T_M) + A_3 \cdot g(T_C - T_M) + A_4 \cdot f(T_M - T_E) + A_5 \cdot (T_M - T_E) + A_6 \cdot g(T_M - T_E) + A_7 \cdot f(T_E - T_{Al}) + A_8 \cdot (T_E - T_{Al}) + A_9 \cdot g(T_E - T_{Al}) + A_{10} \cdot f(T_E - T_{VE}) + A_{11} \cdot (T_E - T_{VE}) + A_{12} \cdot g(T_E - T_{VE}) + A_{13} \cdot f(T_{VE} - T_{FR}) + A_{14} \cdot (T_{VE} - T_{FR}) + A_{15} \cdot g(T_{VE} - T_{FR}) \quad (6)$$

Here, $f(x)$ is a function in which $f(x) = x^{1/2}$ when $x \geq 0$, and $f(x) = -(-x)^{1/2}$ when $x < 0$. For example, $f(T_C - T_M)$ is $(T_C - T_M)^{1/2}$ when $T_C - T_M \geq 0$, and $-(-T_C + T_M)^{1/2}$ when $T_C - T_M < 0$. The $g(x)$ is a function in which $g(x) = x^2$ when $x \geq 0$, and $g(x) = -x^2$ when $x < 0$. For example, $g(T_C - T_M)$ is $(T_C - T_M)^2$ when $T_C - T_M \geq 0$, and $-(T_C - T_M)^2$ when $T_C - T_M < 0$.

In addition, $A_0$ represents a constant term of the relational expression. Each of $A_1$ to $A_{15}$ represents a proportional constant of the relational expression.

The relational expression represented in the equation (6) includes the square root term, the first order term, and the second order term, with respect to the proportional relationship between the processing parameters and the heat quantity. For example, the equation (6) includes the square root term $A_1 \cdot f(T_C - T_M)$, the first order term $A_2 \cdot (T_C - T_M)$, and the second order term $A_3 \cdot g(T_C - T_M)$, with respect to the temperature difference $T_C - T_M$ between the temperature $T_C$ of the center and the temperature $T_M$ of the middle.

Figure 7A:
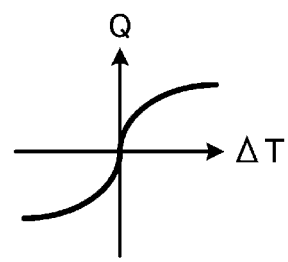
FIG. 7A is a graph representing a characteristic of a square root term.
Figure 7B:
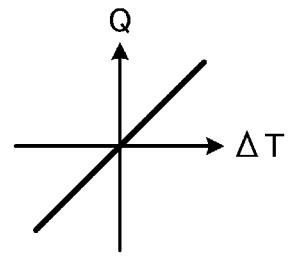
FIG. 7B is a graph representing a characteristic of a first order term.
Figure 7C:
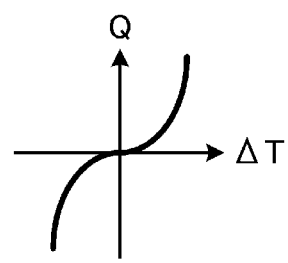
FIG. 7C is a graph representing a characteristic of a second order term.

FIG. 7A is a graph representing a characteristic of the square root term. The square root term is a value corresponding to the square root of the temperature difference $\Delta T$. FIG. 7B is a graph representing a characteristic of the first order term. The first order term is a value corresponding to the temperature difference $\Delta T$. FIG. 7C is a graph representing a characteristic of the second order term. The second order term is a value corresponding to the square of the temperature difference $\Delta T$.

In addition, when the heat input from plasma is taken into account, the relational expression of the above-described equation (3) or (5) may be obtained for each of the zones of the center, the middle, the edge, the very edge, and the focus ring portion, assuming that heat with a heat quantity proportional to a temperature difference between adjacent zones moves between the zones, heat with a heat quantity proportional to a temperature difference between the stage 12 and each zone moves between the stage 12 and the zone, heat with a heat quantity proportional to the square of the supply current to the heater 75 of each zone, heat with a heat quantity proportional to the pressure in the chamber 10, and heat with a heat quantity proportional to the power of the AC power are input to the corresponding zone, and the quantity of heat input and the quantity of heat output in each zone are consistent with each other. For example, when the heat input from plasma is taken into account, the square of the supply current $I_{HE}$ to the heater 75 of the edge may be expressed as the following equation (7) by adding the terms related to the heat input from plasma to the above-described equation (6).

$$(I_{HE})^2 = A_0 + A_1 \cdot f(T_C - T_M) + A_2 \cdot (T_C - T_M) + A_3 \cdot g(T_C - T_M) + A_4 \cdot f(T_M - T_E) + A_5 \cdot (T_M - T_E) + A_6 \cdot g(T_M - T_E) + A_7 \cdot f(T_E - T_{Al}) + A_8 \cdot (T_E - T_{Al}) + A_9 \cdot g(T_E - T_{Al}) + A_{10} \cdot f(T_E - T_{VE}) + A_{11} \cdot (T_E - T_{VE}) + A_{12} \cdot g(T_E - T_{VE}) + A_{13} \cdot f(T_{VE} - T_{FR}) + A_{14} \cdot (T_{VE} - T_{FR}) + A_{15} \cdot g(T_{VE} - T_{FR}) + A_{16} \cdot (HF)^{1/2} + A_{17} \cdot HF + A_{18} \cdot (HF)^2 + A_{19} \cdot (LF)^{1/2} + A_{20} \cdot LF + A_{21} \cdot (LF)^2 + [A_{22} \cdot (HF)^{1/2} + A_{23} \cdot HF + A_{24} \cdot (HF)^2 + A_{25} \cdot (LF)^{1/2} + A_{26} \cdot LF + A_{27} \cdot (LF)^2] \cdot (Pr)^{1/2} + [A_{28} \cdot (HF)^{1/2} + A_{29} \cdot HF + A_{30} \cdot (HF)^2 + A_{31} \cdot (LF)^{1/2} + A_{32} \cdot LF + A_{33} \cdot (LF)^2] \cdot Pr + [A_{34} \cdot (HF)^{1/2} + A_{35} \cdot HF + A_{36} \cdot (HF)^2 + A_{37} \cdot (LF)^{1/2} + A_{38} \cdot LF + A_{39} \cdot (LF)^2] \cdot Pr^2 \quad (7)$$

Here, HF represents the power of the radio-frequency power HF supplied from the first radio-frequency power supply 31 (supply power). LF represents the power of the low frequency power LF supplied from the second radio-frequency power supply 32 (supply power). Pr represents the pressure in the chamber 10. In addition, each of $A_{16}$ to $A_{39}$ represents a proportional constant of the relational expression.

The plasma processing apparatus 101 changes the processing parameters of the plasma processing into a plurality of patterns, and measures the temperature of each zone in a state where the temperature is stabilized for each pattern. For example, the plasma processing apparatus 101 changes the temperature $T_{Al}$ of the stage 12, the power of the radio-frequency power HF, the power of the low frequency power LF, and the pressure Pr in the chamber 10 into a plurality of patterns. Further, the plasma processing apparatus 101 changes desired temperatures of the respective zones into a plurality of patterns, and causes the heater controller 45 to perform a feedback control on the supply currents $I_{HC}$, $I_{HM}$, $I_{HE}$, $I_{HVE}$, and $I_{HFR}$ to the heaters 75 for each pattern so as to make the temperatures of the respective zones reach the desired temperatures of the zones determined as the processing parameters. Then, the plasma processing apparatus 101 measures the temperatures $T_C$, $T_M$, $T_E$, $T_{VE}$, and $T_{FR}$ of the respective zones in a state where the temperatures are stabilized for each pattern, that is, the supply currents $I_{HC}$, $I_{HM}$, $I_{HE}$, $I_{HVE}$, and $I_{HFR}$ to the heaters 75 are stabilized. At this time, the temperatures $T_C$, $T_M$, $T_E$, $T_{VE}$, and $T_{FR}$ of the respective zones are recorded in association with the supply currents $I_{HC}$, $I_{HM}$, $I_{HE}$, $I_{HVE}$, and $I_{HFR}$ to the heaters 75, in the measurement data.

When the prediction model is generated, the administrator generates an experiment plan to determine the patterns for acquiring the measurement data, with respect to the processing parameters. As a method of generating the experiment plan, there is a response surface methodology. For example, the administrator determines the patterns for acquiring the measurement data according to the response surface methodology, with a condition of the relationship of the processing parameters or restrictions.

Here, for example, in the related art, it takes time to generate the map data. For example, it is assumed that the plasma processing apparatus 101 according to the present embodiment is used to generate map data in which while the temperature of the focus ring portion is kept constant, the five temperatures including the temperatures of the four zones of the center, the middle, the edge, and the very edge, and the temperature of the stage 12 are changed into five levels. In this case, the number of patterns to be measured becomes 3,125 (=$5^5$). In the plasma processing apparatus 101, it takes about 5 to 10 minutes until the temperatures become the stable state for each pattern. Accordingly, when the 3,125 patterns are measured, for example, a time period of about 30 days is required.

Meanwhile, in the present embodiment, the number of patterns for acquiring the measurement data may be reduced by using the response surface methodology. For example, in the plasma processing apparatus 101 according to the present embodiment, the number of patterns necessary to generate the prediction model may be reduced to, for example, about 96. The administrator measures the temperatures $T_C$, $T_M$, $T_E$, $T_{VE}$, and $T_{FR}$ of the respective zones when the plasma processing is performed in a state where the temperatures are stabilized for each determined pattern by using the plasma processing apparatus 101, and records the measured temperatures $T_C$, $T_M$, $T_E$, $T_{VE}$, and $T_{FR}$ and the supply currents $I_{HC}$, $I_{HM}$, $I_{HE}$, $I_{HVE}$, and $I_{HFR}$ to the heaters 75 at that time, as the measurement data. When the number of patterns is about 96, all the patterns may be measured for about 1 to 2 days.

Referring back to FIG. 4, in the measurement data 120, the measurement results of the respective patterns measured by the plasma processing apparatus 101 are recorded.

The controller 114 is a device that controls the model generation apparatus 102. As the controller 114, an electronic circuit such as a central processing unit (CPU) or a micro processing unit (MPU), or an integrated circuit such as an application specific integrated circuit (ASIC) or a field programmable gate array (FPGA) may be adopted. The controller 114 has an internal memory for storing a program that defines various process procedures or control data, and executes various processes by the program or control data. The controller 114 functions as various processors as various programs operate. For example, the controller 114 includes an acquisition unit 130, a generator 131, a receiver 132, a calculator 133, and a display controller 134.

The acquisition unit 130 acquires various types of information. For example, the acquisition unit 130 acquires the measurement data transmitted from the plasma processing apparatus 101 via the external I/F 110. The acquisition unit 130 stores the acquired measurement data as the measurement data 120 in the storage 113.

The generator 131 generates the prediction model by using the measurement data 120. For example, the generator 131 obtains a relational expression for each of the zones of the center, the middle, the edge, the very edge, and the focus ring portion, assuming that heat with a heat quantity proportional to a temperature difference between adjacent zones moves between the zones, heat with a heat quantity proportional to a temperature difference between the stage 12 and each zone moves between the stage 12 and the zone, heat with a heat quantity proportional to the square of the supply current to the heater 75 of each zone, heat with a heat quantity proportional to the pressure in the chamber 10, and heat with a heat quantity proportional to the power of the AC power are input to the zone, and the quantity of heat input and the quantity of heat output in each zone are consistent with each other. For example, the generator 131 obtains the relational expression represented in the above-described equation (7), for the edge.

The generator 131 performs a fitting using the measurement data 120 on the obtained relational expression, to calculate a proportional coefficient of the relational expression. For example, the generator 131 performs a fitting using the measurement data 120 on the relational expression of each zone, to calculate a proportional coefficient of the relational expression with which the square sum of the error of the supply current to the heater 75 is the smallest, for each pattern. For example, with respect to the edge, when the square of the supply current $I_{HE}$ to the heater 75 is calculated by substituting the temperature $T_{A1}$ of the stage 12, the power of the radio-frequency power HF, the power of the low frequency power LF, the pressure Pr in the chamber 10, and the temperatures $T_C$, $T_M$, $T_E$, $T_{VE}$, and $T_{FR}$ of the respective zones to the above-described equation (7), the generator 131 calculates values of $A_0$ to $A_{39}$ with which the square sum of the error from the square of the actual supply current $I_{HE}$ to the heater 75 of each zone is the smallest.

The generator 131 applies the calculated proportional coefficient to the relational expression, to generate the prediction model. For example, the generator 131 applies the calculated proportional coefficient to the relational expression of each zone, to generate the prediction model. For example, with respect to the edge, the generator 131 applies the calculated values of $A_0$ to $A_{39}$ to the above-described equation (7), to generate the prediction model of the edge.

The generator 131 stores information of the generated prediction model as the model data 121 in the storage 113. For example, with respect to the edge, the generator 131 stores information of the expression (7) to which the calculated values of $A_0$ to $A_{39}$ are applied, as the model data 121 in the storage 113.

The receiver 132 receives prediction conditions for performing a prediction by using the prediction model. For example, the receiver 132 causes the display 111 to display a prediction condition input screen, and receives an input of the prediction conditions on the input screen by the input unit 112.

Figures 8, 9:
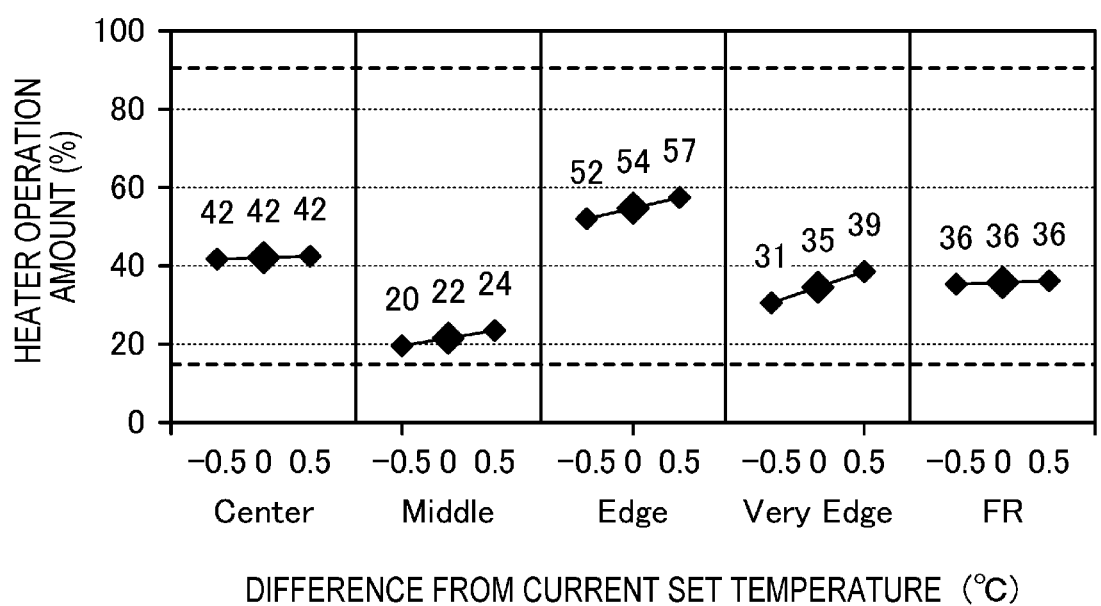
FIG. 8 is a view illustrating an example of a prediction condition input screen according to an embodiment.
FIG. 9 is a view illustrating an example of a prediction result screen according to an embodiment.

FIG. 8 is a view illustrating an example of the prediction condition input screen according to the embodiment. A prediction condition input screen 200 receives an input of the temperature $T_{A1}$ of the stage 12, the temperatures of the respective zones of the center (Center), the middle (Middle), the edge (Edge), the very edge (Very Edge), and the focus ring portion (FR), the power of the radio-frequency power HF, the power of the low frequency power LF, and the pressure Pr in the chamber 10, as the prediction conditions.

The calculator 133 calculates the supply current to the heater 75 of the each zone by using the prediction model stored in the model data 121, to reach the temperature of each zone and the temperature of the stage 12 in the prediction conditions. For example, with respect to the edge, the calculator 133 substitutes the temperature $T_{Al}$ of the stage 12, the temperatures $T_C$, $T_M$, $T_E$, $T_{VE}$, and $T_{FR}$ of the respective zones, the power of the radio-frequency power HF, the power of the low frequency power LF, and the pressure Pr in the chamber 10 to the equation (7) to which the calculated values of $A_0$ to $A_{39}$ are applied, to calculate the supply current $I_{HE}$ to the heater 75 of the edge.

In addition, the calculator 133 further calculates the supply current to each heater 75 to reach changed temperatures obtained by changing the temperature of each zone in the prediction conditions by predetermined values. The predetermined values may be set on the screen. In the present embodiment, the predetermined values are +0.5° C. and −0.5° C. For example, with respect to the edge, the calculator 133 calculates the supply current $I_{HE}$ to the heater 75 of the edge in a case where the temperature $T_M$ of the stage 12 and the temperatures $T_C$, $T_M$, $T_E$, $T_{VE}$, and $T_{FR}$ of the respective zones in the equation (7) to which the calculated values of $A_0$ to $A_{39}$ are applied are changed by +0.5° C. from the temperatures in the prediction conditions. Further, the calculator 133 calculates the supply current $I_{HE}$ to the heater 75 of the edge in a case where the temperature $T_M$ of the stage 12 and the temperatures $T_C$, $T_M$, $T_E$, $T_{VE}$, and $T_{FR}$ of the respective zones in the equation (7) to which the calculated values of $A_0$ to $A_{39}$ are applied are changed by −0.5° C. from the temperatures in the prediction conditions.

The display controller 134 performs a display control to display the prediction results calculated by the calculator 133 on the display 111. For example, the display controller 134 performs a display control to display the supply current to each heater 75 and the controllable range of the supply current to each heater 75 which have been calculated by the calculator 133. Further, the display controller 134 performs a display control to display the supply current to each heater 75 at the temperatures in the prediction conditions related to the heater 75 side by side with the supply current to each heater 75 at the changed temperatures. For example, the display controller 134 performs a control to display a prediction result screen on the display 111 based on the prediction results.

FIG. 9 is a view illustrating an example of the prediction result screen according to the embodiment. Here, the current that may be caused to flow to the heater 75 has an upper limit value. The upper limit value is determined according to a possibility of damage to the stage 12 due to the heat generation of the heaters 75 embedded in the stage 12 or a capacity condition of the heater power supply. Thus, FIG. 9 represents a heater operation amount in a case where the supply current to each heater 75 is standardized by the upper limit value. A prediction result screen 210 displays heater operation amounts at the calculated temperatures of the prediction conditions, for the respective heaters 75 of the center, the middle, the edge, the very edge, and the focus ring portion. Further, the prediction result screen 210 displays the controllable range of the heater operation amount of each heater 75. For example, since the supply current to each heater 75 may not be set to less than 0, the heater operation amount may not be less than 0%. Thus, when the heater operation amount is close to 0%, the range in which the temperature of the heater 75 can be lowered is small. In addition, since the heater operation amount of each heater 75 may not be set to 100% or more, the range in which the temperature of the heater 75 can be increased is small when the heater operation amount is close to 100%. It is preferable that the heater operation amount of each heater 75 has margins near the upper limit and the lower limit. Thus, the prediction result screen 210 represents the positions of 90% and 15% in the heater operation amount of each heater 75 by dashed lines, to represent the range between 90% and 15% as a preferable controllable range. Further, for the heater 75 of each zone, the prediction result screen 210 displays a heater operation amount that corresponds to the supply current to the heater 75 to reach the changed temperatures obtained by changing the temperature of the prediction conditions by the predetermined values (+0.5° C. and −0.5° C.). As a result, when the temperature of each zone is changed by the predetermined values, the administrator may grasp how much the heater operation amount of each heater 75 needs to be changed. Thus, when the temperature of each zone is changed, it is possible to grasp the degree of the margins present in the controllable range of the heater operation amount of each heater 75. In addition, the display controller 134 may cause the prediction result screen 210 to display the supply current to each heater 75, instead of heater operation amount.

The administrator may obtain the process conditions that correspond to a plasma processing to be performed, by using the model generation apparatus 102.

When all of the heater operating amounts of the respective heaters 75 fall within the controllable range having the predetermined margins, for example, the range between 90% and 15% in the example of FIG. 9, the plasma processing may be performed using the heater operation amounts of the heaters 75 as the process conditions.

Meanwhile, when any one of the heater operating amounts of the respective heaters 75 falls within the controllable range having no predetermined margins, for example, the range of 90% or more or the range of 15% or less in the example of FIG. 9, the process conditions may be changed. For example, when the heat input from plasma is kept constant in a case where the heater operation amount is 90% or more, the heat output from each zone to the stage 12 is large. Thus, the heat generation quantity of the heater 75 needs to be increased as much, and as a result, the heater operation amount of the heater 75 becomes high. In this case, the heater operation amount may be made fall within the controllable range having the margins by increasing the temperature $T_{Al}$ of the stage 12. Especially, the fact that the heater operation amount is 100% indicates that the temperature of the heater 75 has eventually reached the set temperature by setting the heater operation amount to the maximum value, or has not reached the set temperature despite the maximum value. Thus, it is necessary to increase the temperature $T_{Al}$ of the stage 12. In addition, for example, when the heater input from plasma is kept constant in a case where the heater operation amount is 15% or less, the heat output from each zone to the stage 12 is small. Thus, the heat generation amount of the heater is unnecessary as much, and as a result, the heater operation amount becomes low. In this case, the heater operation amount may be made fall within the controllable range having the margins by lowering the temperature $T_{Al}$ of the stage 12. Especially, the fact that the heater operation amount is 0% indicates that the temperature of the heater 75 has eventually reached the set temperature by setting the heater operation amount to the minimum value, or has not reached the set temperature despite the minimum value. Thus, it is necessary to lower the temperature $T_{Al}$ of the stage 12. In addition, when the temperature $T_{Al}$ of the stage 12 is changed, it is preferable to perform a prediction using the prediction model by inputting prediction conditions based on the changed condition, and confirm that all of the heater operation amounts of the respective heaters 75 fall within the controllable range having the predetermined margins.

In addition, the controller 114 may include a processor that calculates the temperature $T_{A1}$ of the stage 12 to make the heater operation amounts fall within the controllable range having the predetermined margins, and provide the calculated temperature to the administrator. In addition, the controller 114 may include a processor that automatically changes the conditions of the process to be performed in the plasma processing apparatus 101.

<Flow of Prediction Model Generation Process>

Figure 10:
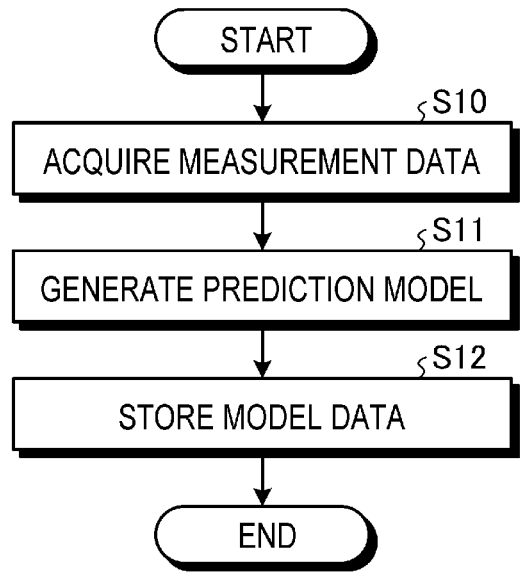
FIG. 10 is a flowchart illustrating an example of a flow of a prediction model generation process according to an embodiment.

Next, descriptions will be made on the flow of the prediction model generation process in which the model generation apparatus 102 according to the embodiment generates the prediction model. FIG. 10 is a flowchart illustrating an example of the flow of the prediction model generation process according to the embodiment.

The acquisition unit 130 acquires the measurement data transmitted from the plasma processing apparatus 101 via the external I/F 110 (step S10). The acquisition unit 130 stores the acquired measurement data as the measurement data 120 in the storage 113.

The generator 131 generates the prediction model by using the measurement data 120 (step S11). For example, the generator 131 obtains a relational expression for each of the zones of the center, the middle, the edge, the very edge, and the focus ring portion, assuming that heat with a heat quantity proportional to a temperature difference between adjacent zones moves between the zones, heat with a heat quantity proportional to a temperature difference between the stage and each zone moves between the stage 12 and the zone, heat with a heat quantity proportional to the square of the supply current to the heater 75 of each zone, heat with a heat quantity proportional to the pressure in the chamber 10, and heat with a heat quantity proportional to the power of AC power are input to the zone, and the quantity of heat input and the quantity of heat output in each zone are consistent with each other. The generator 131 performs a fitting using the measurement data 120 on the obtained relational expression, to calculate a proportional coefficient of the relational expression. The generator 131 applies the calculated proportional coefficient to the relational expression, to generate the prediction model.

The generator 131 stores information of the generated prediction model as the model data 121 in the storage 113 (step S12), and the process is ended.

<Flow of Prediction Process>

Figure 11:
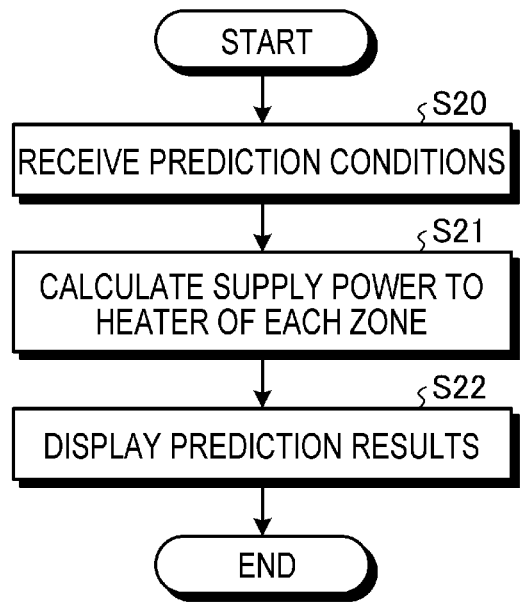
FIG. 11 is a flowchart illustrating an example of a prediction process according to an embodiment.

Next, descriptions will be made on the flow of the prediction process in which the model generation apparatus 102 according to the embodiment predicts the process conditions by using the prediction model. FIG. 11 is a flowchart illustrating an example of the flow of the prediction process according to the embodiment.

The receiver 132 receives the prediction conditions (step S20). For example, the receiver 132 causes the display 111 to display the prediction condition input screen, and receives an input of the prediction conditions on the input screen by the input unit 112.

The calculator 133 calculates the supply current to the heater 75 of each zone by using the prediction model stored in the model data 121, to reach the temperature of each zone and the temperature of the stage 12 in the prediction conditions (step S21).

The display controller 134 displays the prediction results calculated by the calculator 133 on the display 111 (step S22), and the process is ended.

<Effects>

As described above, in the plasma processing apparatus 101 for performing a plasma processing according to the embodiment, the stage 12 is provided inside the chamber 10 to place the wafer W thereon, the temperature regulator (the chiller unit 71, the Brine, and the coolant pipe 70) is provided in the stage 12 to regulate the temperature of the entire stage 12, the heater 75 is provided in each zone obtained by dividing the placing surface of the stage 12, and the heater controller 45 is provided to regulate the temperature of the thermometer 78 of each zone to reach a predetermined value by changing the value of the factor related to the power flowing to the heater 75. The model generation apparatus 102 acquires the measurement data 120 from the plasma processing apparatus 101. The measurement data 120 are the temperature of each zone and the value of the factor related to the power flowing to the heater 75 which are obtained in a state where the temperature of each zone is stabilized after the plasma processing apparatus 101 changes the processing parameters of the plasma processing that include at least a temperature of the temperature regulator and the temperature of each zone into a plurality of patterns, and starts a control to change the value of the factor related to the power flowing to the heater 75 by using the heater controller 45 for each pattern to make the temperature of each zone reach the temperature of each zone determined as the processing parameters. The model generation apparatus 102 generates the prediction model indicating the relationship of the processing parameters by using the acquired measurement data 120, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater 75 of each zone is input to the corresponding zone, and the quantity of heat input and the quantity of heat output in each zone are consistent with each other. As a result, the model generation apparatus 102 may obtain the process conditions that correspond to a plasma processing to be performed.

In addition, in the model generation apparatus 102 according to the embodiment, the processing parameters further include the pressure in the chamber 10 and the power of the AC power applied for generating plasma. The model generation apparatus 102 generates the prediction model, assuming that heat with a heat quantity proportional to each of the pressure in the chamber 10 and the power of the AC power is further input to each zone. As a result, the model generation apparatus 102 may generate the prediction model in which the pressure in the chamber 10 and the power of the AC power are taken into account.

In addition, the model generation apparatus 102 according to the embodiment determines the relational expression, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater 75 of each zone, heat with a heat quantity proportional to the pressure in the chamber 10, and heat with a heat quantity proportional to the power of the AC power are input to the zone, and the quantity of heat input and the quantity of heat output in each zone are consistent with each other. The model generation apparatus 102 performs a fitting using the acquired measurement data 120 on the determined relational expression, to calculate a proportional coefficient of the relational expression. The model generation apparatus 102 applies the calculated proportional coefficient to the relational expression, to generate the prediction model. As a result, the model generation apparatus 102 may generate the prediction model that appropriately models the relationship among the temperature of the temperature regulator, the temperature of each zone, and the value of the factor related to the power flowing to the heater 75. For example, the model generation apparatus 102 may predict the value of the factor related to the power flowing to the heater 75, from the temperature of the temperature regulator and the temperature of each zone.

In addition, in the model generation apparatus 102 according to the embodiment, the square root term, the first order term, and the second order term are included in the proportional relationship between the processing parameters and the heat quantity in the relational expression. The model generation apparatus 102 performs a fitting using the acquired measurement data 120, to calculate the proportional coefficients of the square root term, the first order term, and the second order term. The model generation apparatus 102 applies the calculated proportional coefficients to the square root term, the first order term, and the second order term, to generate the prediction model. As a result, the model generation apparatus 102 may model the proportional relationship between the processing parameters and the heat quantity with the satisfactory accuracy.

In addition, the model generation apparatus 102 according to the embodiment receives the prediction conditions that include at least the temperature of each zone and the temperature of the temperature regulator. The model generation apparatus 102 calculates the value of the factor related to the power of the heater 75 of each zone by using the prediction model, to reach the temperature of each zone and the temperature of the temperature regulator in the prediction conditions. The model generation apparatus 102 performs a display control based on the calculated value of the factor related to the power of each heater 75. As a result, the model generation apparatus 102 may provide the administrator with the value of the factor related to the power of the heater 75 of each zone to reach the temperature of each zone and the temperature of the temperature regulator in the prediction conditions. For example, when the value of the factor is the supply current to the heater 75, the model generation apparatus 102 may provide the supply current to the heater 75 of each zone to reach the temperature of each zone and the temperature of the temperature regulator in the prediction conditions.

In addition, the model generation apparatus 102 according to the embodiment displays the calculated value of the factor related to the power of the heater 75 and the controllable range of the value of the factor related to the power of each heater 75. As a result, the model generation apparatus 102 may provide the administrator with the information of whether the value of the factor related to the power of each heater 75 falls within the appropriate range. When the provided value of the factor related to the power of each heater does not fall within the appropriate range, the administrator may change the prediction conditions to perform the prediction again by the model generation apparatus 102, so that the appropriate value of the factor related to the power of each heater 75 may be obtained.

In addition, the model generation apparatus 102 according to the embodiment further calculates the value of the factor related to the power of each heater 75 to reach the changed temperatures obtained by changing the temperature of each zone in the prediction conditions by the predetermined values. The model generation apparatus 102 displays the value of the factor related to the power of each heater 75 at the temperature in the prediction conditions side by side with the value of the factor related to the power at the changed temperatures. As a result, the model generation apparatus 102 may also provide the administrator with the value of the factor related to the power of each heater 75 in a case where the temperature of each zone is changed to the changed temperatures. Thus, when the temperature of each zone is changed by the predetermined values, the administrator may grasp how much the value of the factor related to the power of each heater 75 needs to be changed. As a result, when the temperature of each zone is changed, it is possible to grasp whether there exist margins in the controllable range of the value of the factor related to the power of each heater 75.

In addition, the model generation apparatus 102 according to the embodiment assumes that the value of the factor related to the power flowing to the heater 75 is the supply current to the heater 75. In addition, the model generation apparatus 102 assumes that the heat quantity calculated from the value of the factor related to the power is proportional to the square of the supply current to the heater 75. As a result, when the supply current to the heater 75 is controlled to control the temperature of the heater 75 in the plasma processing, the model generation apparatus 102 may generate the prediction model that corresponds to the plasma processing to be performed.

While the various embodiments have been described, the present disclosure is not limited to the embodiments and may be configured in various modified aspects. For example, while the capacitively coupled plasma processing apparatus has been described as the plasma processing apparatus 101, the plasma processing apparatus 101 may be an arbitrary plasma processing apparatus. For example, the plasma processing apparatus 101 may be any type of plasma processing apparatus, such as an inductively coupled plasma processing apparatus or a plasma processing apparatus that excites a gas by surface waves such as microwaves.

In addition, in the above-described embodiments, for example, the relational expression of each of the zones of the center, the middle, the edge, the very edge, and the focus ring portion includes the terms representing the heat transfers between all respective adjacent zones. For example, as indicated by the dashed lines in FIG. 6, the equation (5) or (7) for the edge includes the terms representing the heat transfers between the respective adjacent zones of the center, the middle, the edge, the very edge, and the focus ring portion. However, the present disclosure is not limited thereto. For example, the relational expression of each zone may include only a term representing the heat transfer between zones present in a predetermined distance. As a result, the relational expression is simplified, so that the calculation amount for generating the prediction model may be reduced. Further, even when the relational expression includes the terms representing the heat transfers between all respective adjacent zones as in the equation (5) or (7), there is no problem because the term that affects less the operation amount $I_{HE}$ becomes a value with a small proportional constant as a result of a fitting.

In addition, in the above-described embodiments, for example, the value of the factor related to the power flowing to the heater 75 is the supply current to the heater 75. However, the value of the factor related to the power may be the supply voltage to the heater 75. In this case, as described above, the heat generation quantity of the heater 75 is proportional to the square of the supply voltage to the heater 75, so that the prediction model may be generated along the same flow as described above. As a result, the model generation apparatus 102 may generate the prediction model that appropriately models the relationship among the temperature of the temperature regulator, the temperature of each zone, and the supply voltage to the heater 75, and for example, may predict the supply voltage to the heater 75 from the temperature of the temperature regulator and the temperature of each zone. Further, the value of the factor related to the power may be the supply power to the heater 75. In this case, as described above, the heat generation quantity of the heater 75 is proportional to the supply power to the heater 75, so that the prediction model may be generated along the same flow as described above. As a result, the model generation apparatus 102 may generate the prediction model that appropriately models the relationship among the temperature of the temperature regulator, the temperature of each zone, and the supply power to the heater 75, and for example, may predict the supply power to the heater 75 from the temperature of the temperature regulator and the temperature of each zone In addition, in the above-described embodiments, when data is acquired from the plasma processing apparatus 101, in a case where the item related to the heat input from plasma is excluded from the processing parameters of the plasma processing, the temperature $T_{Al}$ of the stage 12 and the temperature of each zone are used. However, instead of the temperature of each zone, the supply current to each zone may be used. At this time, the plasma processing apparatus 101 changes the processing parameters of the plasma processing into a plurality of patterns, and measures the temperature of each zone in a state where the temperature is stabilized for each pattern. For example, the plasma processing apparatus 101 changes the temperature $T_{Al}$ of the stage 12, the supply currents $I_{HC}$, $I_{HM}$, $I_{HE}$, $I_{HVE}$, and $I_{HFR}$ to the heaters 75 of the respective zones, the power of the radio-frequency power HF, the power of the lower frequency power LF, and the pressure Pr in the chamber 10 into a plurality of patterns, and measures the temperatures $T_C$, $T_M$, $T_E$, $T_{VE}$, and $T_{FR}$ of the respective zones in a state where the temperatures are stabilized for each pattern. The plasma processing apparatus 101 records the temperature $T_{Al}$ of the stage 12 and the temperatures $T_C$, $T_M$, $T_E$, $T_{VE}$, and $T_{FR}$ of the respective zones, in association with the supply currents $I_{HC}$, $I_{HM}$, $I_{HE}$, $I_{HVE}$, and $I_{HFR}$ to the heaters 75 in the measurement data, for each pattern. The model generation apparatus 102 acquires the measurement data as the measurement data 120. The model generation apparatus 102 generates the prediction model representing the relationship of the processing parameters by using the acquired measurement data 120, assuming that heat with a heat quantity proportional to a temperature difference between adjacent zones moves between the zones, heat with a heat quantity proportional to a temperature difference between the temperature regulator and the zone moves between the temperature regulator and the zone, heat with a heat quantity calculated from the value of the factor related to the power flowing to the heater 75 of each zone is input to the zone, and the quantity of heat input and the quantity of heat output in each zone are consistent with each other.

In addition, in the above-described embodiments, for example, the model generation apparatus 102 performs the generation of the prediction model and the prediction using the prediction model. However, the present disclosure is not limited thereto. For example, the plasma processing apparatus 101 may perform the generation of the prediction model and the prediction using the prediction model. In this case, the plasma processing apparatus 101 functions as the model generation apparatus.

In addition, in the above-described embodiments, for example, the model generation apparatus 102 performs both the generation of the prediction model and the prediction using the prediction model. However, the present disclosure is not limited thereto. For example, separate apparatuses may perform the generation of the prediction model and the prediction using the prediction model.

According to the present disclosure, it is possible to obtain the process conditions that correspond to a plasma processing to be performed, by using the prediction model.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A model generation apparatus comprising:
a memory; and
a processor coupled to the memory and configured to:
acquire measurement data from a plasma processing apparatus including a stage provided inside a processing container to place a substrate thereon, a temperature regulator provided in the stage to regulate a temperature of the entire stage, a heater provided in each zone obtained by dividing a placing surface of the stage, and a heater controller provided to regulate a temperature of a thermometer of each zone to a predetermined value by changing a value of a factor related to a power flowing to the heater, wherein the measurement data includes the temperature of each zone and the value of the factor related to the power flowing to the heater which are obtained in a state where the temperature of each zone is stabilized after the plasma processing apparatus changes processing parameters of the plasma processing that include at least a temperature of the temperature regulator and the temperature of each zone into a plurality of patterns, and starts a control to change the value of the factor related to the power flowing to the heater by using the heater controller for each pattern to make the temperature of each zone reach the temperature of each zone determined as the processing parameters; and
generate a prediction model representing a relationship of the processing parameters by using the acquired measurement data, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

2. The model generation apparatus according to claim 1, wherein the processing parameters further include a pressure in the processing container and an AC power to be applied for generating plasma, and the processor is configured to generate the prediction model assuming that heat with a heat quantity proportional to each of the pressure in the processing container and the AC power is further input to each zone.

3. The model generation apparatus according to claim 2, wherein the processor performs a fitting using the acquired measurement data, on a relational expression determined by assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone, heat with a heat quantity proportional to the pressure in the processing container, and heat with a heat quantity proportional to the power of the AC power are input to the corresponding zone, and a quantity of heat input and a quantity of heat output in each zone are consistent with each other, to calculate a proportional coefficient of the relational expression, and applies the calculated proportional coefficient to the relational expression to generate the prediction model.

4. The model generation apparatus according to claim 3, wherein the relational expression includes a square root term, a first order term, and a second order term with respect to a proportional relationship between the processing parameters and the heat quantity, and the processor performs a fitting using the acquired measurement data to calculate proportional coefficients of the square root term, the first order term, and the second order term of the relational expression, and applies the calculated proportional coefficients to the square root term, the first order term, and the second order term of the relational expression to generate the prediction model.

5. The model generation apparatus according to claim 4, wherein the processor is further configured to:

receive a prediction condition that includes at least the temperature of each zone and the temperature of the temperature regulator, calculate the value of the factor related to the power of the heater of each zone by using the prediction model, to reach the temperature of each zone and the temperature of the temperature regulator in the prediction condition; and perform a display control based on the value of the factor related to the power of the heater which is calculated by the calculator.

6. The model generation apparatus according to claim 5, wherein the processor performs a display control to display the calculated value of the factor related to the power of each heater, along with a controllable range of the value of the factor related to the power of the heater.

7. The model generation apparatus according to claim 6, wherein the processor further calculates the value of the factor related to the power of each heater, to reach a changed temperature obtained by changing the temperature of each zone in the prediction condition by a predetermined value, and performs a display control to display the value of the factor related to the power of each heater at the temperature in the prediction condition side by side with the value of the factor related to the power at the changed temperature.

8. The model generation apparatus according to claim 7, wherein the value of the factor related to the power is a supply current to the heater, and a heat quantity calculated from the value of the factor related to the power is proportional to the square of the supply current to the heater.

9. The model generation apparatus according to claim 7, wherein the value of the factor related to the power is a supply voltage to the heater, and a heat quantity calculated from the value of the factor related to the power is proportional to the square of the supply voltage to the heater.

10. The model generation apparatus according to claim 7, wherein the value of the factor related to the power is a supply power to the heater, and a heat quantity calculated from the value of the factor related to the power is proportional to the square of the supply power to the heater.

11. The model generation apparatus according to claim 5, wherein the processor further calculates the value of the factor related to the power of each heater to reach a changed temperature obtained by changing the temperature of each zone in the prediction condition by a predetermined value, and performs a display control to display the value of the factor related to the power of each heater at the temperature in the prediction condition side by side with the value of the factor related to the power at the changed temperature.

12. The model generation apparatus according to claim 1, wherein the processor is further configured to:

receive a prediction condition that includes at least the temperature of each zone and the temperature of the temperature regulator, calculate the value of the factor related to the power of the heater of each zone by using the prediction model, to reach the temperature of each zone and the temperature of the temperature regulator in the prediction condition; and perform a display control based on the value of the factor related to the power of the heater which is calculated by the calculator.

13. The model generation apparatus according to claim 1, wherein the value of the factor related to the power is a supply current to the heater, and a heat quantity calculated from the value of the factor related to the power is proportional to the square of the supply current to the heater.

14. The model generation apparatus according to claim 1, wherein the value of the factor related to the power is a supply voltage to a heater, and a heat quantity calculated from the value of the factor related to the power is proportional to the square of the supply voltage to the heater.

15. The model generation apparatus according to claim 1, wherein the value of the factor related to the power is a supply power to the heater, and a heat quantity calculated from the value of the factor related to the power is proportional to the square of the supply power to the heater.

16. A non-transitory computer-readable storage medium storing a model generation program that causes a computer to execute a process comprising:

acquiring measurement data from a plasma processing apparatus including a stage provided inside a processing container to place a substrate thereon, a temperature regulator provided in the stage to regulate a temperature of the entire stage, a heater provided in each zone obtained by dividing a placing surface of the stage, and a heater controller provided to regulate a temperature of a thermometer of each zone to a predetermined value by changing a value of a factor related to a power flowing to the heater, wherein the measurement data includes the temperature of each zone and the value of the factor related to the power flowing to the heater which are obtained in a state where the temperature of each zone is stabilized after the plasma processing apparatus changes processing parameters of the plasma processing that include at least a temperature of the temperature regulator and the temperature of each zone into a plurality of patterns, and starts a control to change the value of the factor related to the power flowing to the heater by using the heater controller for each pattern to make the temperature of each zone reach the temperature of each zone determined as the processing parameters; and generating a prediction model representing a relationship of the processing parameters by using the measurement data acquired at the acquiring, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

17. A model generation method comprising:

acquiring measurement data from a plasma processing apparatus including a stage provided inside a processing container to place a substrate thereon, a temperature regulator provided in the stage to regulate a temperature of the entire stage, a heater provided in each zone obtained by dividing a placing surface of the stage, and a heater controller provided to regulate a temperature of a thermometer of each zone to a predetermined value by changing a value of a factor related to a power flowing to the heater, wherein the measurement data includes the temperature of each zone and the value of the factor related to the power flowing to the heater which are obtained in a state where the temperature of each zone is stabilized after the plasma processing apparatus changes processing parameters of the plasma processing that include at least a temperature of the temperature regulator and the temperature of each zone into a plurality of patterns, and starts a control to change the value of the factor related to the power flowing to the heater by using the heater controller for each pattern to make the temperature of each zone reach the temperature of each zone determined as the processing parameters; and generating a prediction model representing a relationship of the processing parameters by using the measurement data acquired at the acquiring, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

18. A model generation apparatus comprising:

a memory; and a processor coupled to the memory and configured to:

acquire measurement data from a plasma processing apparatus including a stage provided inside a processing container to place a substrate thereon, a temperature regulator provided in the stage to regulate a temperature of the entire stage, and a heater provided in each zone obtained by dividing a placing surface of the stage to regulate a temperature of the zone, wherein the measurement data includes the temperature of each zone obtained when the plasma processing apparatus changes processing parameters of the plasma processing that include at least a temperature of the temperature regulator and the value of the factor of the power flowing to the heater of each zone into a plurality of patterns, and measures the temperature of each zone in a state where the temperature is stabilized for each pattern; and generate a prediction model representing a relationship of the processing parameters by using the acquired measurement data, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

19. A non-transitory computer-readable storage medium storing a model generation program that causes a computer to execute a process comprising:

acquiring measurement data from a plasma processing apparatus including a stage provided inside a processing container to place a substrate thereon, a temperature regulator provided in the stage to regulate a temperature of the entire stage, and a heater provided in each zone obtained by dividing a placing surface of the stage to regulate a temperature of the zone, wherein the measurement data includes the temperature of each zone obtained when the plasma processing apparatus changes processing parameters of the plasma processing that include at least a temperature of the temperature regulator and the value of the factor of the power flowing to the heater of each zone into a plurality of patterns, and measures the temperature of each zone in a state where the temperature is stabilized for each pattern; and generating a prediction model representing a relationship of the processing parameters by using the measurement data acquired at the acquiring, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

20. A model generation method comprising:

acquiring measurement data from a plasma processing apparatus including a stage provided inside a processing container to place a substrate thereon, a temperature regulator provided in the stage to regulate a temperature of the entire stage, and a heater provided in each zone obtained by dividing a placing surface of the stage to regulate a temperature of the zone, wherein the measurement data includes the temperature of each zone obtained when the plasma processing apparatus changes processing parameters of the plasma processing that include at least a temperature of the temperature regulator and the value of the factor of the power flowing to the heater of each zone into a plurality of patterns, and measures the temperature of each zone in a state where the temperature is stabilized for each pattern; and generating a prediction model representing a relationship of the processing parameters by using the measurement data acquired at the acquiring, assuming that heat with a heat quantity proportional to a temperature difference between adjacent zones moves between the zones, heat with a heat quantity proportional to a temperature difference between the temperature regulator and each zone moves between the temperature regulator and the zone, heat with a heat quantity calculated from the value of the factor related to the power flowing to the heater of each zone is input to the corresponding zone, and a quantity of heat input and a quantity of heat output in each zone are consistent with each other.

\* \* \* \* \*